(12) United States Patent
Brill

(10) Patent No.: US 8,488,128 B2
(45) Date of Patent: Jul. 16, 2013

(54) LINE EDGE ROUGHNESS MEASURING TECHNIQUE AND TEST STRUCTURE

(75) Inventor: Boaz Brill, Rehovot (IL)

(73) Assignee: Nova Measuring Instruments Ltd., Rehovot (IL)

( * ) Notice: Subject to any disclaimer, the term of this patent is extended or adjusted under 35 U.S.C. 154(b) by 0 days.

(21) Appl. No.: 12/919,488

(22) PCT Filed: Mar. 1, 2009

(86) PCT No.: PCT/IL2009/000233
§ 371 (c)(1),
(2), (4) Date: Oct. 8, 2010

(87) PCT Pub. No.: WO2009/107143
PCT Pub. Date: Sep. 3, 2009

(65) Prior Publication Data
US 2011/0037988 A1    Feb. 17, 2011

Related U.S. Application Data

(60) Provisional application No. 61/032,093, filed on Feb. 28, 2008.

(51) Int. Cl.
*G01B 11/30*    (2006.01)
(52) U.S. Cl.
USPC ........ 356/600; 356/636; 356/237.2; 356/625; 438/638; 438/703

(58) Field of Classification Search
USPC .............. 356/600, 636, 237.2, 625; 438/637, 438/638, 780, 703, 695, 689
See application file for complete search history.

(56) References Cited

U.S. PATENT DOCUMENTS

| | | | |
|---|---|---|---|
| 6,370,680 | B1 | 4/2002 | Nguyen |
| 7,184,152 | B2 | 2/2007 | Brill |
| 7,310,155 | B1 * | 12/2007 | Capodieci et al. ............ 356/625 |
| 2012/0141693 | A1 * | 6/2012 | Ward et al. .................... 250/307 |

OTHER PUBLICATIONS

Chengqing Wang, Ronald L. Jones, Eric K. Lin, Wen-li Wu, John S. Villarrubia, Kwang-Woo Choi, James S. Clarke, Bryan J. Rice, Michael J. Leeson, Jeanette Roberts, Robert Bristol, Benjamin Bunday, "Line edge roughness characterization of sub-50nm structures using CD-SAXS: round-robin benchmark results", Proc. SPIE, Apr. 5, 2007, vol. 6518, 651810 (2007), SPIE, Bellingham WA, USA.

* cited by examiner

*Primary Examiner* — Gregory J Toatley
*Assistant Examiner* — Iyabo S Alli
(74) *Attorney, Agent, or Firm* — Daniel J. Swirsky; AlphaPatent Associates Ltd.

(57) ABSTRACT

A test structure is presented test structure on a substrate for monitoring a LER and/or LWR effect, said test structure comprising an array of features manufactured with amplified LER and/or LWR effect.

14 Claims, 2 Drawing Sheets

LINE EDGE ROUGHNESS MEASURING TECHNIQUE AND TEST STRUCTURE

CROSS-REFERENCE TO RELATED APPLICATIONS

This application is a U.S. National Phase Application under 35 U.S.C. 371 of PCT International Application No. PCT/IL2009/000233 which has an international filing date of Mar. 1, 2009, and which claims priority from U.S. Provisional Patent Application No. 61/032,093, filed Feb. 28, 2008, all of which disclosures are hereby incorporated by reference.

FIELD OF THE INVENTION

This invention is in the field of measurement techniques, and relates to design of test structure and technique for measurement parameters of patterned structures. The present invention is particularly useful for controlling semiconductor manufacturing process.

BACKGROUND OF INVENTION

Line edge roughness (LER) and line width roughness (LWR) refer to the non-smoothness of edges of features printed using lithographical methods or features that have been transferred by different methods, e.g. etching, from such features. As the line width shrinks with advanced technology nodes the relative thickness of LER increases as it becomes a larger fraction of the total line width.

There are several methods for LER measurement, including e.g. SEM images (CD-SEM), AFM scans and various optical methods, e.g. angle-dependent spectral scatterometry, angle-dependent laser scatterometry, spectral ellipsometry, however all measurements suffer from the fact that LER effect has very small values and is stochastic by nature.

SUMMARY OF THE INVENTION

In accordance with present invention proposed are new test structure and a measurement method using such test structure that enable better measurement of LER regardless of the measurement tool used.

BRIEF DESCRIPTION OF THE DRAWINGS

In order to understand the invention and to see how it may be carried out in practice, several different preferred embodiments will now be described, by way of non-limiting examples only, with reference to the accompanying drawings, in which.

DETAILED DESCRIPTION OF A PREFERRED EMBODIMENT

Proposed technique is based on a fact that lithography is a strongly non-linear process. When exposed to different doses of radiation the photoresist will generally react according to a threshold—it will transform into a chemical state that will later be removed by development depending on whether on not the local amount of radiation is above a certain threshold. This effect is indeed only a part of a more complicated process, involving, among others, also the activation effect of post-exposure-base, however it is still a dominant part of the dynamics of photolithography. If fact, this non-linear effect is usually amplified by resist manufacturers in order to allow smaller line widths to be printed without being affected too much by light scattering, residual fields due to interference etc.

It therefore is the case that around the line edge, where LER happens, there was initially a very strong gradient of the radiation field. Since the photoresist is composed of discrete molecules it is now up to the single molecule to "decide" whether it is above or below the exposure threshold. It would further reasonable to assume that there exists a certain range of "uncertainty" in the radiation field where different molecules will react differently based on other "thermo-dynamical" parameters or even based on quantum statistics. Hence, it would be reasonable to conclude that the amount of LER will depend monotonically on the gradient of the radiation field around the threshold level.

The present invention is based on the above conclusion by attempting to artificially create conditions that are likely to produce larger LER. The test structures considered below are designed in a way that reduces the gradient of the radiation field, hence creating a larger spatial range in which the conditions of the lithography are not strongly defined, i.e. are close to the threshold, allowing statistical and chaotic conditions to create a larger LER.

Figure 1:
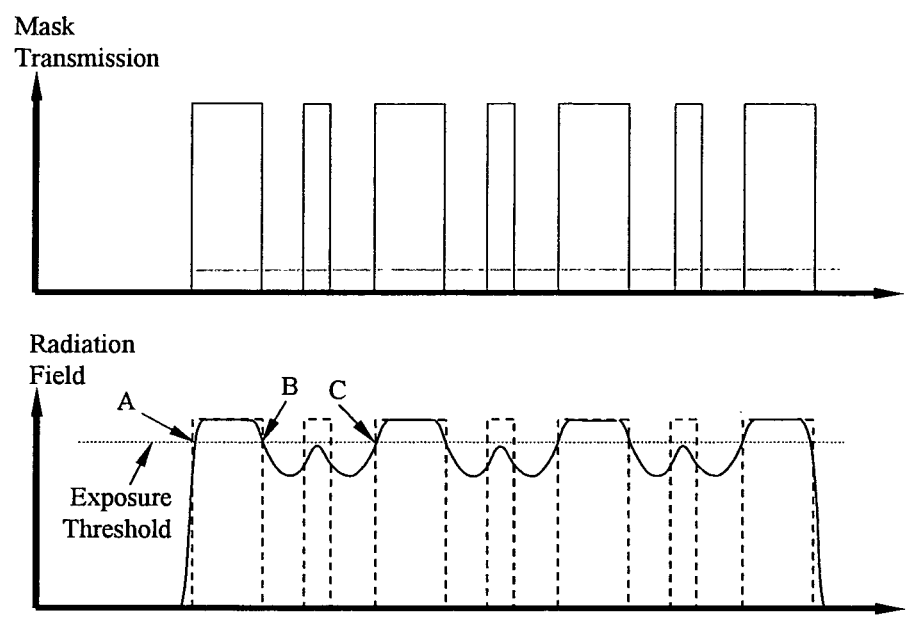
FIG. 1 schematically illustrates a radiation field in the presence of sub-resolution features, FIG. 2A schematically illustrates a photolithography mask for manufacturing 1-D test site.

In order to create a small radiation field gradient, the idea is to use proximity effects, e.g. with sub-resolution features, as used in mask design. The typical situation is presented in FIG. 1, presenting the radiation field along one axis of a line array. The mask contains alternating lines of variable thickness, one above the exposure threshold and one below it, hence only the thicker lines will be actually printed. Due to proximity effects from the sub-resolution line, the actual radiation field is expected to resemble the solid line in the lower graph. Notice that in both points B and C the local radiation field gradient at the threshold level is lower than the corresponding gradient at point A. Based on the argumentation above, we could therefore expect the line edge roughness at B and C to be significantly higher than at point A.

According to the above principles there are several possible designs of test structures that can be utilized in order to enhance the possibility to measure LER. Below are given several examples of using this principle.

Figure 2A:
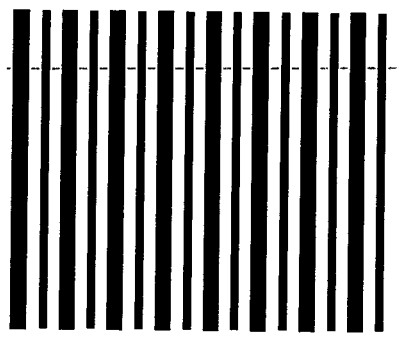
FIG. 2B schematically illustrates a photolithography mask for manufacturing 2-D test site.

(a) Line array—the test site in this case is a line array with alternating thickness of lines, as illustrated in FIG. 2A, such that only the wider lines are printed. Using such a test structure the LER can be amplified to a level that can be easily detected and measured by different measurement methods.

(b) By combining two test sites, one manufactured using a mask as in shown in FIG. 2A and the other being a regular line array with the same nominal CD, significant information can be deduced from the comparison of the two sites. The difference in resulting CD's can contribute knowledge on the sensitivity of the features to the proximity effects. In accordance with additional aspect of the present invention, both sites could be measured by an optical scatterometry tool capable comparing common merit function (a measure of the difference between measurement and model that does not contain direct reference to LER), it can be possible to obtain a relative measure of the LER. Since the model does not take into account the LER effect, the larger the LER the poorer will be the fitting level between the experimental spectra and the model. Hence, as LER grows Merit Function grows and the difference in merit function between the two sites will be roughly proportional to the amount of added LER.

Figure 2B:
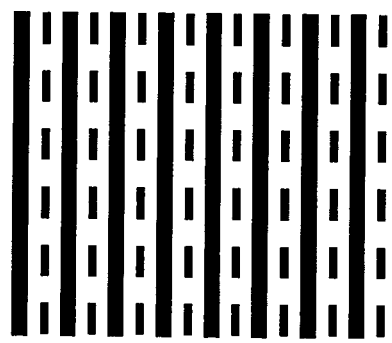

(c) FIG. 2B illustrates a mask with 2-D array comprised of alternating wider lines and smaller dots or rectangles arranged along a parallel line can also be constructed that could be used for manufacturing a test site in accordance with another aspect of the present invention. In this case the induced LER amplification will be done mostly in the spatial frequency of the rectangles. Different such structures with different periods of the rectangles can allow the separation between different frequencies of the LER changes.

Those skilled in the art will readily appreciate that various modifications and changes can be applied to the embodiments of the invention as hereinbefore exemplified without departing from its scope defined in and by the appended claims.

The invention claimed is:

1. A test structure on a substrate for monitoring a LER (Line Edge Roughness) and/or LWR effect (Line Width Roughness) during processing of said substrate, wherein said test structure comprises an array of features manufactured using artificial conditions providing amplified LER and/or LWR effect.

2. A test structure as in claim 1, wherein said amplified LER and or LWR effect applied substantially along single axis of said array.

3. A test structure as in claim 1, wherein said array of features being 2-D array.

4. A test structure as in claim 3, wherein said amplified LER and/or LWR effect applied substantially along two mutually perpendicular axis of said array.

5. A test structure as in claim 1, wherein said amplified LER and/or LWR effect caused by exposing using a mask having sub-resolution mask features.

6. A test structure as in claim 5, wherein said sub-resolution mask features forming a 1-D array.

7. A test structure as in claim 5, wherein said sub-resolution mask features forming a 2-D array.

8. A test structure as in claim 1, being useful for an optical measurement.

9. A test structure as in claim 8, being useful for a scatterometric measurement.

10. A test structure as in claim 8, being useful for a spectral scatterometric measurement.

11. A test structure as in claim 1 further comprising an additional array of features characterized by substantially the same CD as the features manufactured with amplified LER and/or LWR effect.

12. An article comprising at least one test structure for monitoring a LER (Line Edge Roughness) and/or LWR effect (Line Width Roughness) during processing said substrate, wherein said test structure comprises an array of features manufactured using artificial conditions providing amplified LER and/or LWR effect.

13. An article as in claim 12 wherein said article is a semiconductor wafer.

14. An article as in claim 12 wherein said at least one test structure for monitoring a LER and/or LWR effect further comprising an additional array of features characterized by substantially the same CD as the features manufactured with amplified LER and/or LWR effect.

* * * * *